US009247683B2

(12) United States Patent
Davis et al.

(10) Patent No.: US 9,247,683 B2
(45) Date of Patent: Jan. 26, 2016

(54) METHOD OF ASSEMBLY OF A VIDEO DISPLAY SYSTEM

(71) Applicant: TAIT TOWERS, INC., Lititz, PA (US)

(72) Inventors: Adam Davis, Leola, PA (US); Frederic Frank Opsomer, Kortemark (BE)

(73) Assignee: Tait Towers Manufacturing, LLC, Lititz, PA (US)

( * ) Notice: Subject to any disclaimer, the term of this patent is extended or adjusted under 35 U.S.C. 154(b) by 382 days.

(21) Appl. No.: 13/688,759

(22) Filed: Nov. 29, 2012

(65) Prior Publication Data
US 2013/0086797 A1  Apr. 11, 2013

Related U.S. Application Data

(63) Continuation-in-part of application No. 12/411,478, filed on Mar. 26, 2009, now Pat. No. 8,727,293.

(51) Int. Cl.
| G09F 7/00 | (2006.01) |
| H05K 13/00 | (2006.01) |
| G09F 9/33 | (2006.01) |

(52) U.S. Cl.
CPC ........ *H05K 13/00* (2013.01); *G09F 9/33* (2013.01); *Y10T 29/49002* (2015.01)

(58) Field of Classification Search
CPC .......... A47B 96/00; A47B 96/06; A47F 5/00; A47F 7/00; E04B 1/343; E04H 3/26; G09F 13/00; G09F 13/04; G09F 7/00; G09F 9/00; G09F 9/30–9/3026; G09F 9/33; G09F 9/37; G09G 3/32

USPC ............... 29/428, 525.01, 433, 464–468; 40/606.01, 606.02, 606.14, 606.16, 40/606.17, 606.04, 610, 611.05, 581, 605, 40/601

See application file for complete search history.

(56) References Cited

U.S. PATENT DOCUMENTS

| 4,512,097 A | 4/1985 | Zeigler |
| 4,660,901 A | 4/1987 | Shimada |
| 5,388,943 A | 2/1995 | Nadherny |
| 5,623,786 A | 4/1997 | DeMeyer |
| 5,738,422 A | 4/1998 | Welborn, Jr. et al. |
| 5,802,772 A | 9/1998 | Burke et al. |
| 6,021,909 A | 2/2000 | Tang et al. |
| 6,704,989 B1 * | 3/2004 | Lutz et al. .................... 29/428 |
| 6,813,853 B1 * | 11/2004 | Tucker ........................ 40/448 |
| 7,088,508 B2 | 8/2006 | Ebina et al. |
| 7,126,816 B2 | 10/2006 | Krah |
| 9,103,590 B2 * | 8/2015 | Hartwell ................. F26B 25/18 |
| 2001/0026247 A1 | 10/2001 | Nishio et al. |
| 2008/0263924 A1 * | 10/2008 | Nearman et al. .......... 40/607.13 |
| 2009/0290076 A1 * | 11/2009 | Tait et al. .................. 348/836 |

* cited by examiner

*Primary Examiner* — David Bryant
*Assistant Examiner* — Jun Yoo
(74) *Attorney, Agent, or Firm* — McNees Wallace & Nurick LLC

(57) ABSTRACT

A method for assembling a display system includes positioning and selectively engaging a plurality of modules together to form a first tier, lifting the first tier, positioning and selectively engaging a plurality of modules together to form a second tier, and attaching the second tier to the first tier.

9 Claims, 12 Drawing Sheets

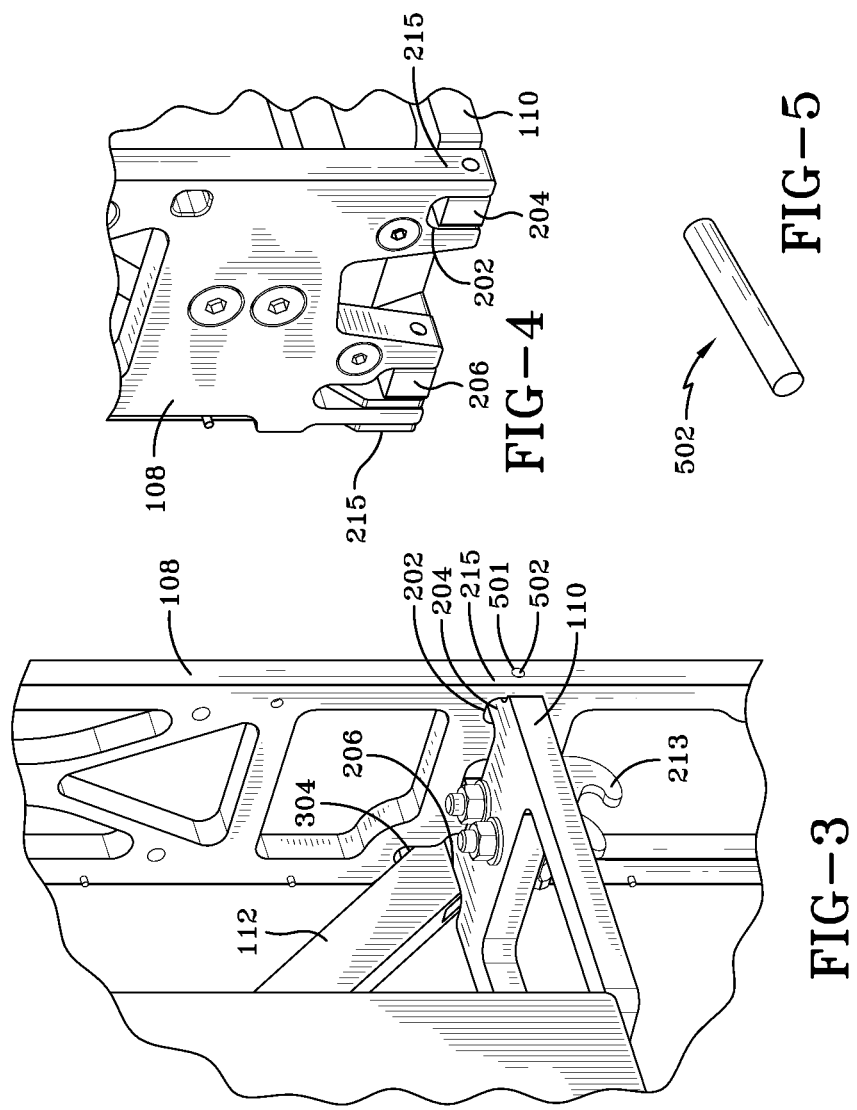

METHOD OF ASSEMBLY OF A VIDEO DISPLAY SYSTEM

FIELD OF THE DISCLOSURE

The present disclosure relates to video display systems, and more specifically, the present disclosure relates to a method of assembling and disassembling video display systems.

BACKGROUND OF THE DISCLOSURE

In the performance industry, video displays are used in conjunction with multi-media systems utilized in productions. Video displays can be limited in size due to the complexity of arranging the video displays.

When being used as part of a touring production, video displays are often consolidated and stored for transportation. Known systems require significant time for arranging (for example, consolidating, disassembling, and assembling). The video displays may be assembled by individuals of varying level of skill. The arranging of these video displays may require complex diagrams, may require several tools, and may be difficult to repair or replace.

Therefore, there is an unmet need to provide a method of assembling and disassembling video display systems that is easy to assemble and/or disassemble, requires a minimum, if any, of tools, and easily permits repair or replacement of a video display.

SUMMARY OF THE DISCLOSURE

One aspect of the disclosure refers to a method for assembling a display system including positioning and selectively engaging a plurality of modules together to form a first tier. The method further includes lifting the first tier. The method further includes positioning and selectively engaging a plurality of modules together to form a second tier. The method further includes attaching the second tier to the first tier.

An advantage of the present disclosure is that the method of assembling the video display can be easily assembled with little or no specialized tools or skill.

Still yet another advantage of the present disclosure is that the system and video support structures provide increased flexibility with respect to maintenance, repair and replacement.

Yet another advantage of the present disclosure is that a video display module can be replaced while the video display system is raised or in a suspended position above the ground.

Further aspects of the method and system are disclosed herein. The features as discussed above, as well as other features and advantages of the present disclosure will be appreciated and understood by those skilled in the art from the following detailed description and drawings.

BRIEF DESCRIPTION OF THE DRAWINGS

FIG. 3 shows an enlarged, partial perspective view of the video support structure in FIG. 2.

FIG. 4 shows another enlarged, partial perspective view of the video support structure in FIG. 2.

FIG. 5 shows a perspective view of an exemplary pin.

DESCRIPTION OF THE DISCLOSURE

Figure 1:
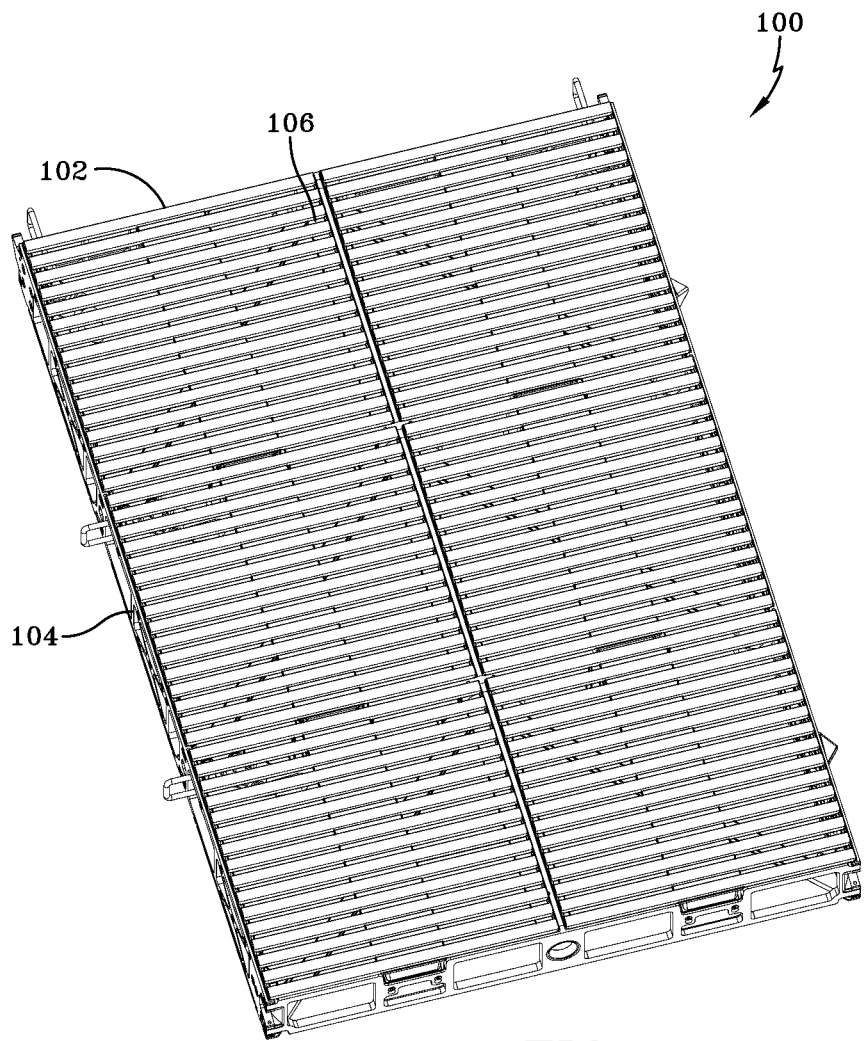
FIG. 1 shows a perspective view of an exemplary embodiment of a video display system.

FIG. 1 shows a video display module 100 including light emitting units 102 and a video support structure 104. In one embodiment, a video display module 100 comprises a panel including light emitting units 102. The panel can be attached onto portions or the entire video display module 100. The panels can be semi-translucent, semi-transparent, transparent, translucent, semi-opaque, opaque, or combinations. In one embodiment, panels may permit high resolution including a large number of colored, closely spaced pixels permitting a clear, high resolution image, series of images, and/or video. In one embodiment, video display module 100 can include one or more light emitting units 102 extending in one direction therealong, such as in a substantially lateral direction, i.e., substantially parallel or substantially perpendicular with respect to one end of video display module 100, which end can coincide with a portion of the periphery of video support structure 104. In one embodiment, ends of video display module 100 can be different from or non-coincident with the periphery of video support structure 104. In one embodiment, at least one of the ends of video display module 100 and the orientation of light emitting units can be different than a portion of the periphery of video support structure 104. In another embodiment, video display module 100 can include one or more light emitting units 102 extending in multiple directions or orientations and in different sizes and/or shapes therealong. In another embodiment, a single light emitting unit 102 can substantially extend to the periphery of video support structure 104 or be substantially the same size as video support structure 104, although in other embodiments light emitting unit 102 can be significantly smaller than the peripheral area of video support structure 104. It is to be understood that additional details regarding video modules and other components may be contained in Applicant's U.S. application Ser. No. 13/543,000, which is hereby incorporated in its entirety.

In an exemplary embodiment, the light emitting units may be a plurality of sets of light emitting diodes (LEDs). In addition, LEDs may be connected by electrical and/or control wires or other connectors with or without additional structural support. In one embodiment, a large number of closely spaced LEDs may be included, thereby creating the effect that LEDs are high resolution. In another embodiment, the light emitting units may include other light sources, for example organic light emitting diodes (OLEDs), incandescent bulbs, fluorescent bulbs, polymer light emitting diodes, electroluminescent lights, other suitable light emitting sources, and/or a combination of light emitting units. The light emitting units 102 may be provided as individual elongate units or may be units of alternate geometries that provide the desired visual or video effect. Light emitting units 102 can be individually secured to video support structure 104 by a plurality of clips 106 or other suitable securing device. As will be appreciated, clips 106 may be separate or integral with video support structure 104. In one embodiment, the light emitting units 102 (or other light sources) may be secured by adhesive. In another embodiment, the light emitting units 102 (or other light sources) may be secured by a plurality of fasteners.

In one embodiment, light emitting units 102 may be powered by individual batteries housed with LEDs or other light sources. In another embodiment, one or more LEDs can have a battery power source and one or more other LEDs can use the battery as a power source by having wires carrying power from other LEDs.

Another embodiment includes OLEDs as LEDs. OLEDs may reduce power requirements and permit longer operation on the same charge. OLEDs may permit light emitting units 102 to run on the same charge for a long period of time, for example, by providing power to the OLEDs and then disconnecting the power source from the OLEDs, and then displaying the system.

Figure 2:
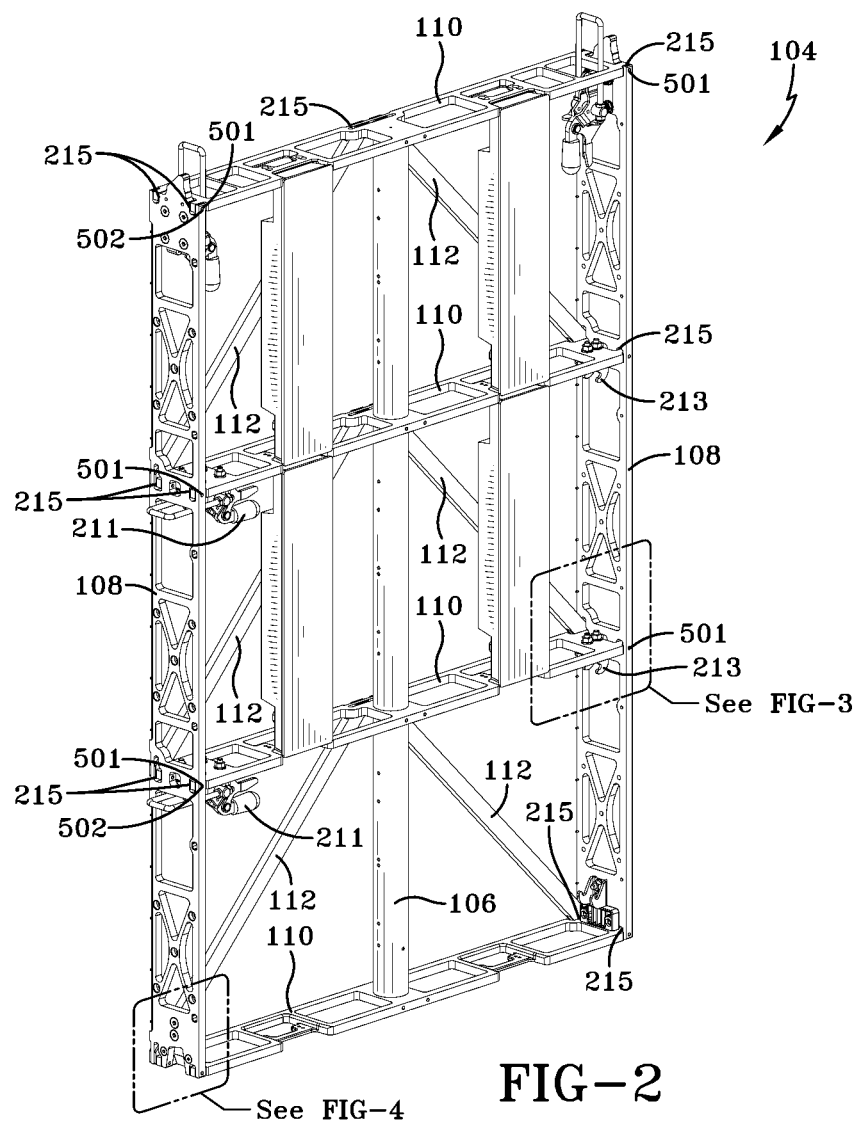
FIG. 2 shows a perspective view of an exemplary embodiment of a video support structure.

FIGS. 2 through 4 show video support structure 104 including a support member 108, a cross member 110, and a brace 112. Two support members 108 can be included, four cross members 110 can be included, and six braces 112 can be included. Each of the connections provided between support members 108, cross members 110, and braces 112 can include at least one pinned connection (see FIGS. 3 and 4).

Support members 108 bound two outer portions of video support structure 104. In other embodiments, more or fewer than two supports members 108 may be included. Each support member 108 can be arranged and disposed to attach to four cross members 110 and three braces 112. Each of the connections between support member 108 and either cross member 110 or brace 112 include a pinnable joint 215. The term "pinnable joint" as used herein, is meant to include a joint or pinned connection securable by a pin or similar device passed through an opening 501 in each of the joining components. In other embodiments, support member 108 may be arranged and disposed to attach to fewer or more cross members 110 and/or braces 112.

Figure 6:
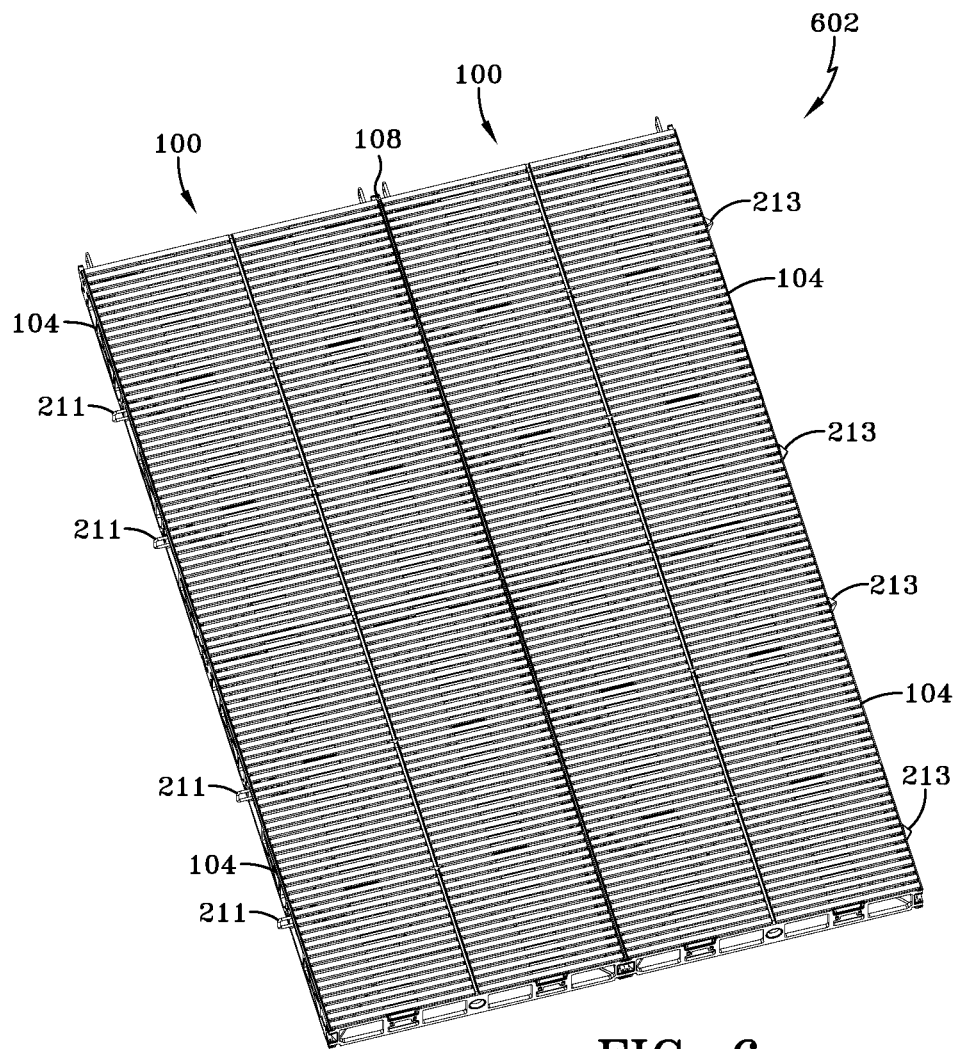
FIG. 6 shows a perspective view of another exemplary embodiment of a video display system.
Figure 10:
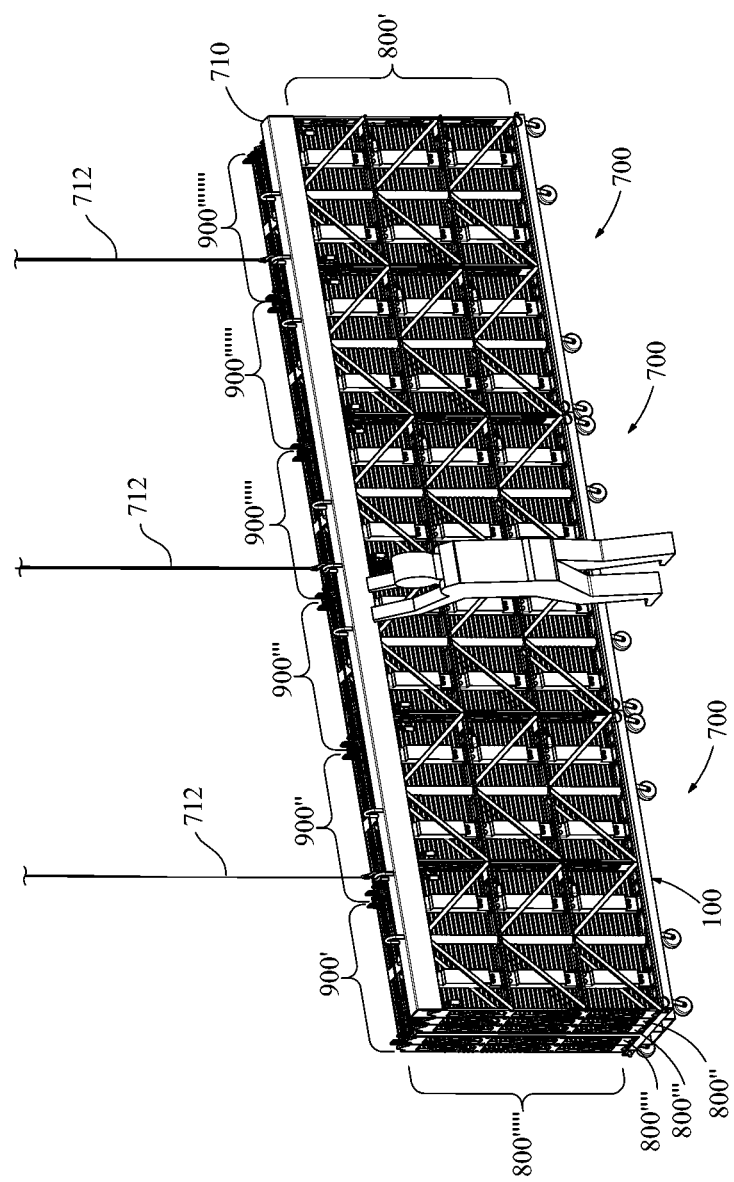
FIG. 10 shows a perspective view prior to lifting a first tier of an exemplary video display system.

In yet another embodiment, as further shown in FIG. 6, a plurality of video display modules 100 are connected to each other at or near a support of video support structure 104. Referring to FIGS. 2 and 6, video support structures 104 can include latches 211 and hooks 213. Latches 211 and hooks 213 can be fastened along cross members 110 such that the latches can selectively engage and secure adjacent video support structures 104. Additionally or alternatively, latches 211 and hooks 213 can be included on support member 108 to engage video display modules 100 above or below. That is, even when a video display system 602 (e.g., FIG. 13) comprising an array of video display modules 100 has been raised or suspended in midair, such as in preparation of a performance, by selectively disengaging latches 211 and hooks 213 of one or more video display modules 100, the one or more video display modules 100 can be removed and/or replaced as needed. In one embodiment, the video display module 100 to be removed or replaced may also need to be selectively secured/disconnected from a lifting device (FIG. 10). As shown in FIG. 6, the plurality of video display modules 100 can produce video display system 602. In one embodiment, video display system 602 comprises video display module 100. Video display system 602 can be supported by the connections between the video display modules 100 or can be supported by a cable or other device that is capable of distributing the weight of the video display system 602 and provides stability and/or support. Video display system 602 can be used in theatrical events, concerts, and/or other suitable presentations. In one embodiment, the combined weight of video display modules 100 constituting video display system 602 is less than the combined weight of systems including welds that form a video display. In another embodiment, video display modules 100 and, thus, video display system 602 can be fabricated from materials that are not desirable or unsuitable for welding.

Referring again to FIGS. 2 through 4, support member 108 can be configured to interlock with another support member 108 or a corresponding support (not shown). Support member 108 can be fabricated from any suitable material. Suitable materials may include metal, such as aluminum or other machined or formable metal. The material should be strong enough to provide adequate support to light emitting units 102 (and/or another light source), but not be undesirably heavy. In addition, the material for fabrication should be able to flexibly handle strain, temperature variations and environmental conditions. In other embodiments, the support may be of a different material including, but not limited to, steel, composite or ceramic, such as stainless steel or carbon composite.

In one embodiment, cross member 110 can be arranged and disposed to receive two support members 108 and four braces 112. In other embodiments, the member may be arranged and disposed to receive more or fewer of the supports and/or the braces. Brace 112 can be arranged and disposed to receive one support member 108 and two cross members 110. Generally, brace 112 should decrease shifting between support member 108 and cross member 110. The use of brace 112 provides resistance to shifting or flexing of the structure that may cause video support structure 104 to lose its rectangular shape, for example altering the desired geometry from the rectangular shape to a rhombus shape. Shifting in such a manner could result in forces detaching light emitting units 102 (and/or other light sources) from support member 108 and cross member 110. Cross member 110 and brace 112 may be fabricated from any suitable metal including, but not limited to, the same materials from which support member 108 is fabricated. Suitable materials include, but are not limited to, aluminum, steel, composite or other machinable material.

The arrangement of support members 108, cross members 110, and braces 112 can include pinnable joints 215 that engage and attach the individual support members 108, cross members 110, and/or braces 112 into a locked position. The pinnable joints 215 can include pins 502 or other suitable pin-like devices that can be compression fit or otherwise driven and retained in openings 501 in the support members 108, cross members 110, braces 112 and/or other components of the video display module 100. In one exemplary embodiment, the pinnable joints 215 may lock and engage the joints between the support members 108, cross members 110, and/or braces 112. In another exemplary embodiment, the pinnable joints 215 may form tight tolerances for the assembled video display module 100. In the embodiment shown in FIG. 2, a plurality of pins 502 (see FIG. 5) can be included for use in the pinnable joints 215. Pins 502 can be a cylindrical body or other suitable geometry. Pins 502 can be inserted into openings 501 that have been formed in support member 108 at a portion at or near where support member 108 receives cross member 110. Pins 502 can pass through support member 108 into a corresponding opening 501 in cross member 110. In an exemplary embodiment, the pin 502 may be compression fit or otherwise driven into openings 501, such that pin 502 is held in place. In another exemplary embodiment, this portion may be where brace 112 is received by support member 108. In this embodiment, pin 502 may be inserted through openings 501 in each of support member 108, cross member 110, and brace 112.

Pin 502 can be inserted through support member 108 and cross member 110 proximal to where the light emitting units 102 are affixed to support member 108 and cross member 110. In one embodiment, insertion of pin 502 may be proximal to light emitting units 102 (and/or other light sources) to prevent pin 502 from protruding from support member 108. Such protrusion may result in an uneven surface to receive the light emitting units (and/or other light sources). Pin 502 can be of a diameter slightly larger than the diameter in the corresponding openings 501. This slightly larger diameter can permit pins 502 to compress upon being inserted through support member 108 and cross member 110 or support member 108, cross member 110, and brace 112. Upon being compressed, pin 502 can be secured. In one embodiment, insertion of the pins may be achieved by striking the pins with a rubber mallet (not shown) or other similar tool. In other embodiments, pins 502 may be of a diameter smaller than openings 501.

Upon pin 502 being inserted through support member 108 and cross member 110 or support member 108, cross member 110, and brace 112, pin 502 can be secured by flaring the end of pin 502. In one embodiment, pin 502 may be secured by using a cotter pin or similar device. In another embodiment, pin 502 may include angled portions allowing it to be rotated and secured. In another embodiment, pin 502 may be secured by adhesive. In another embodiment, the retention of pins 502 in the pinned connection may be such that repair or replacement may require pins 502 to be removed or otherwise displaced. Upon removal of pins 502, components such as support members 108, cross members 110, and braces 112, can be repaired or replaced and a new pinnable joints 215 can be formed.

Referring to FIGS. 3 and 4, corresponding geometry of support member 108, cross member 110, and brace 112 can permit pins 502 to secure video support structure 104. Support member 108 can include an opening 202 configured to receive a protrusion 204 of cross member 110. Opening 202 and protrusion 204 can be secured by pin 502 at pinnable joints 215. Generally, opening 202 and protrusion 204 while secured can form a right angle through formation of two pinnable joints 215; however, some relative movement may occur to permit metal to relax, to permit flexibility, and to permit metal to expand such as during changes in temperature.

The geometry of support member 108, cross member 110, and brace 112 on internal portions of video support structure 104 can be similarly configured to provide corresponding substantially coplanar surfaces. Referring to FIGS. 3 and 4, the pinnable joints 215 permit pins 502 to secure video support structure 104. The corresponding geometry of support member 108 and cross member 110 at the internal portions of video support structure 104 can provide a non-planar surface. In other embodiments, the corresponding geometry of support member 108 and cross member 110 at the internal portions of video support structure 104 may provide a substantially planar surface for affixing light emitting units 102 (and/or other light sources). The geometry of support member 108 and cross member 110 can further correspond with the geometry of brace 112. The geometry of support member 108 can include enlarged opening 304 corresponding with brace 112. The geometry of cross member 110 can include recessed portion 206 permitting brace 112 to be secured by pin 502 at pinnable joints 215 with support member 108 and cross member 110, while being substantially coplanar with portions of support member 108 and portions of cross member 110.

Figure 7:
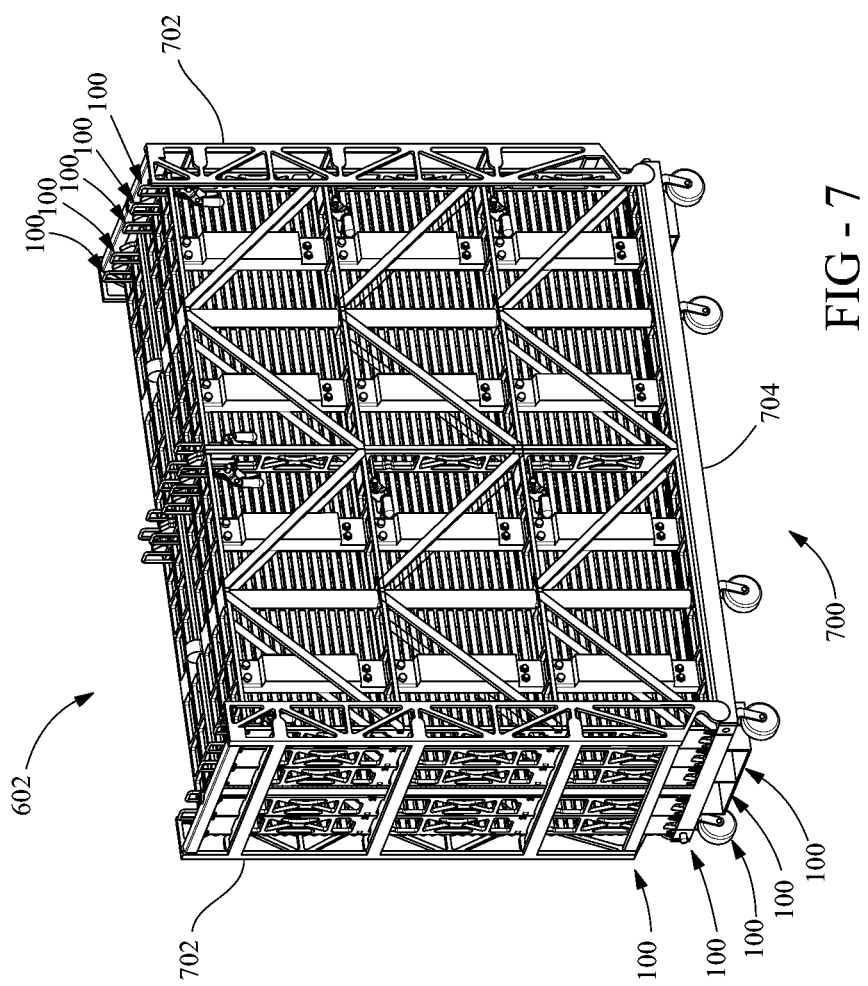
FIG. 7 shows a perspective view of an exemplary embodiment of a display storage unit.
Figure 8:
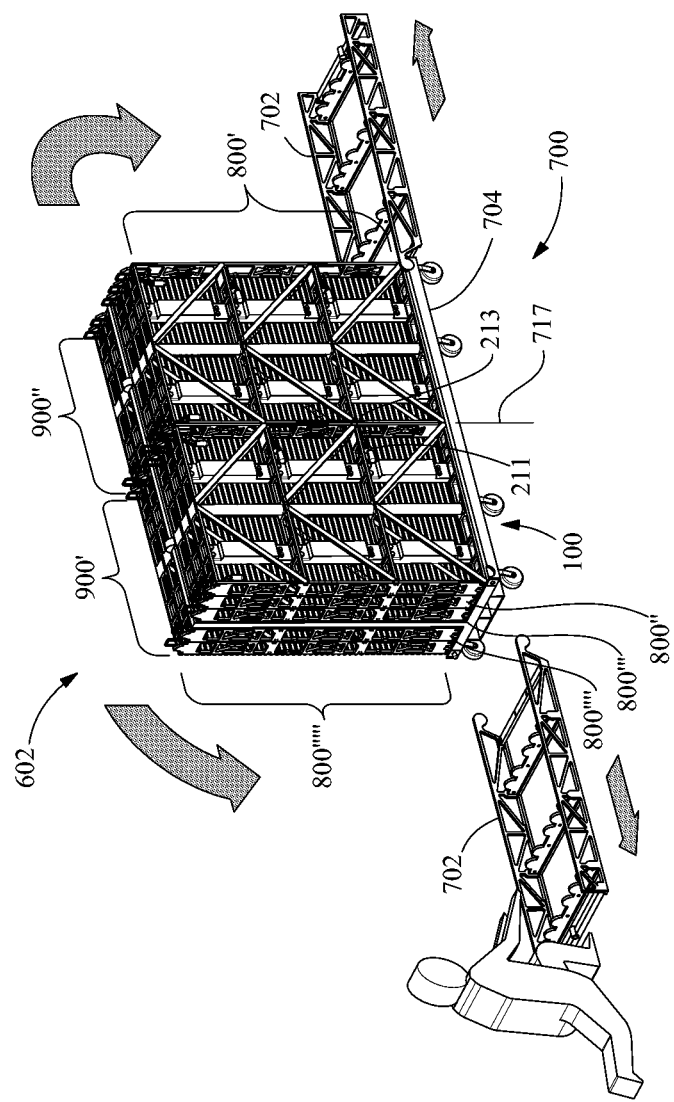
FIG. 8 shows a perspective view of a partially disassembled display storage unit in FIG. 7.
Figure 12:
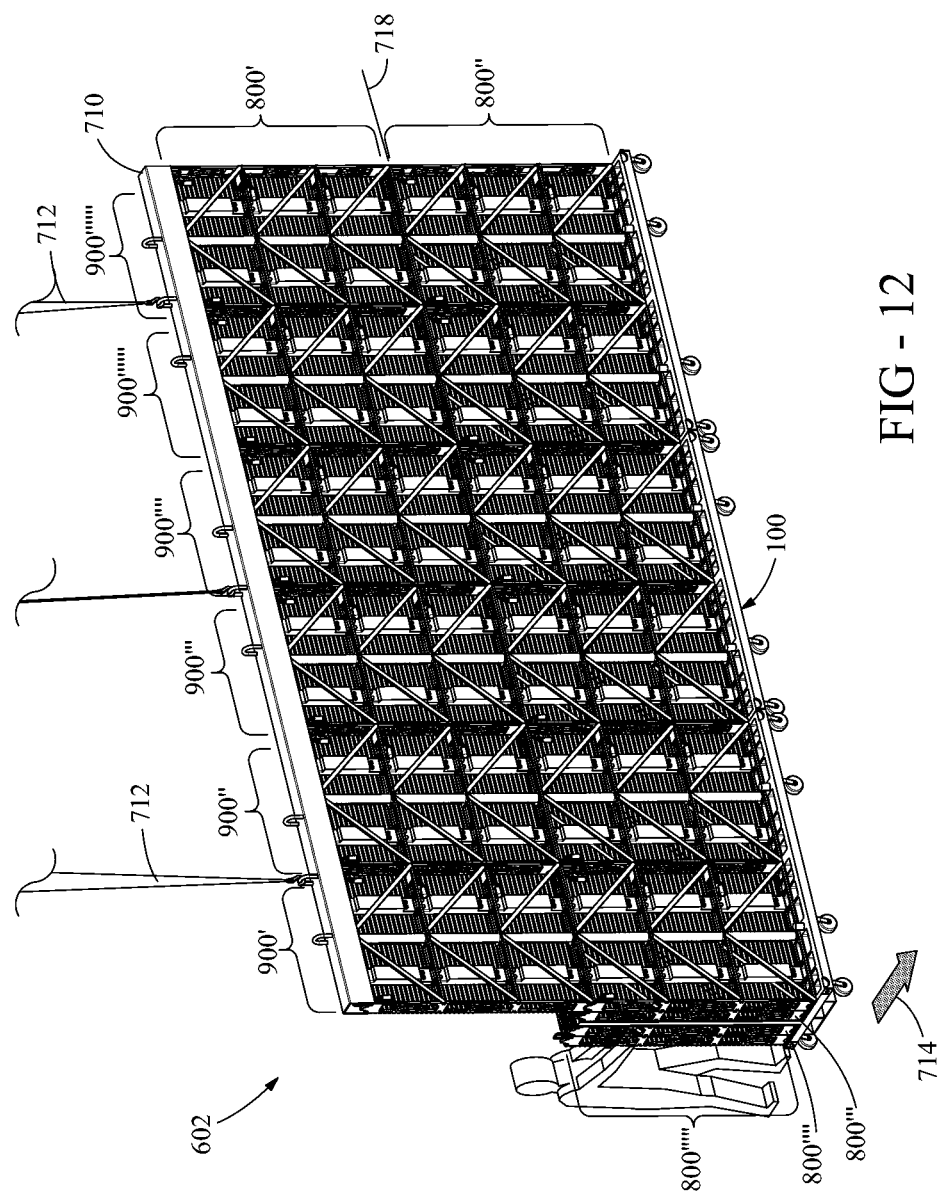
FIG. 12 shows a perspective view prior to lifting a second tier of the video display system in FIG. 11.
Figure 13:
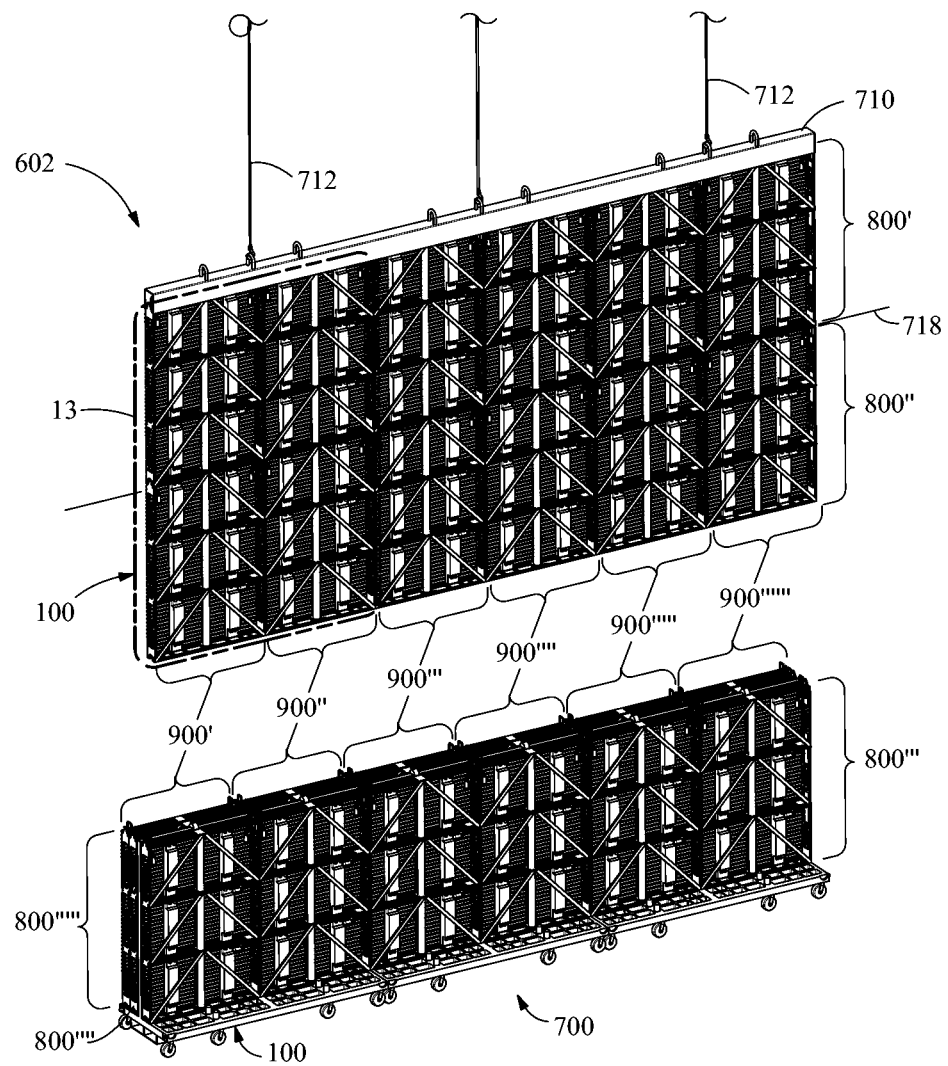
FIG. 13 shows a perspective view of the lifted first and second tiers of the video display in FIG. 12.
Figure 14:
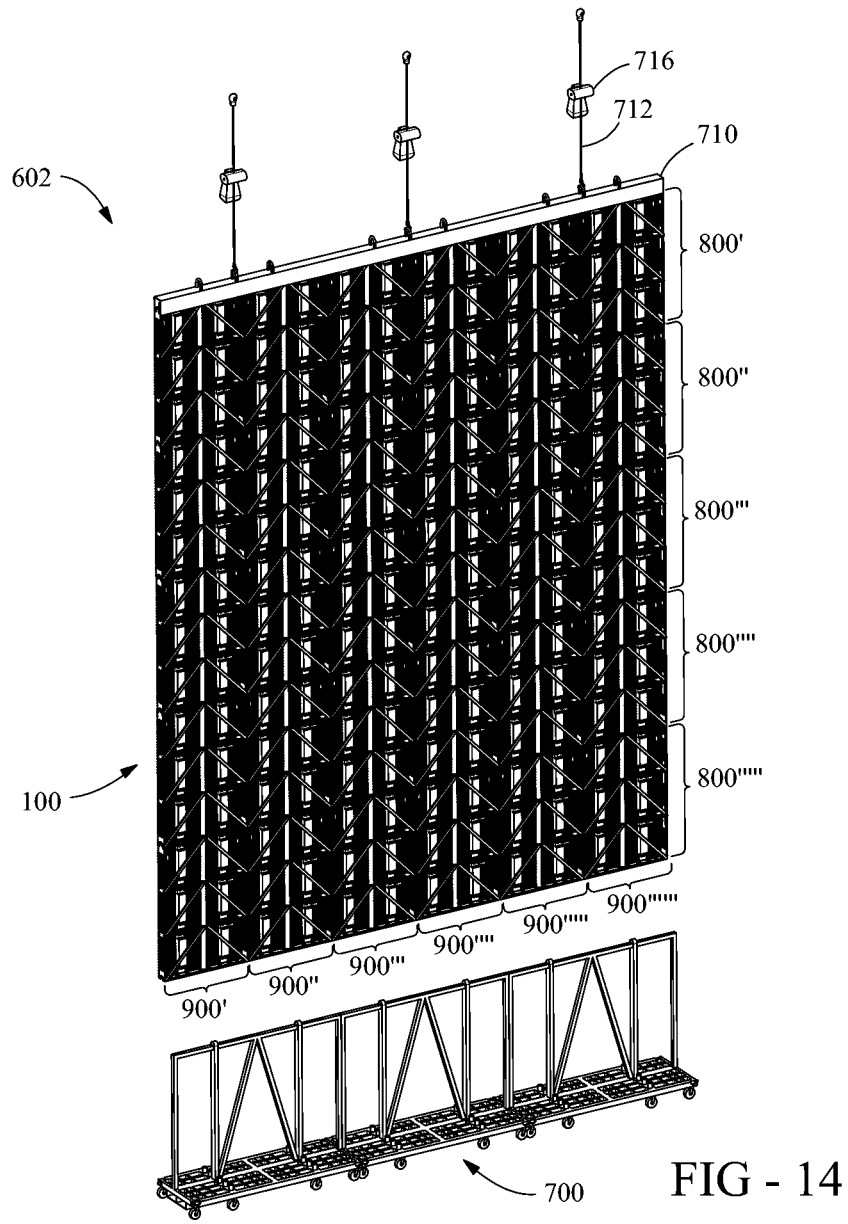
FIG. 14 shows a perspective view subsequent to lifting all tiers of the video display in FIG. 13.

FIGS. 7 through 14 collectively show a method for assembly or constructing a video display system 602. For purposes of clarity for describing the embodiment of the disclosure, FIGS. 7 through 14 show the back side of the video display components, i.e., the side opposite that which would normally be seen by an audience (i.e., facing light emitting units 102 (FIG. 1)) during a performance. Referring collectively to FIGS. 7 and 8, a display storage unit 700, for example, a mobile cart, can be configured for receiving and/or storing video display modules 100. In one embodiment, one or more video display modules 100 can form video display system 602. As further shown in FIG. 7, display storage unit 700 is in a transport mode, having protective side frames 702 secured to display storage unit 700. The display storage unit 700 has any suitable geometry capable of receiving and/or storing video display modules 100 of the video display system 602. For example, display storage unit 700 can be a cuboid structure with or without walls and having a bottom or base 704 sized for receiving video display modules 100. As shown in FIG. 8, display storage unit 700 is in an operating mode for deploying (removing and/or receiving) video display modules 100 upon removal or disassembly of protective side frames 702 from display storage unit 700. Display storage unit 700 secures video display modules 100 that will be arranged in layers or tiers 800, such as denoted by first tier 800', second tier 800'', third tier 800''', fourth tier 800'''', and fifth tier 800''''' (FIG. 8 showing tiers secured/stored on display storage unit 700; FIG. 14 showing tiers suspended above the display storage unit 700) thereby permitting stepwise assembly of a large video display system 602. In one embodiment, video display system 602 can have one tier 800 (e.g., first tier 800') and in another embodiment, video display system 602 can have more than five tiers 800. In one embodiment, multiple display storage units 700 may be required to provide the number of tiers 800 required for video display system 602. Similarly, as further shown in FIG. 8, display storage unit 700 secures an arrangement of video display modules 100 that will be arranged in columns 900, such as first column 900' and second column 900'', thereby permitting stepwise assembly of the large video display system 602. In one embodiment, such as shown in FIG. 8, mutually facing ends of first column 900' and second column 900'' can be interconnected to each other along an interconnection region 717 while the corresponding video display modules 100 are secured/stored on video storage unit 700. In one embodiment, one display storage unit 700 can receive and/or store at least one column 900, although in another embodiment, one display storage unit 700 can receive and/or store three or more columns 900.

Figure 9:
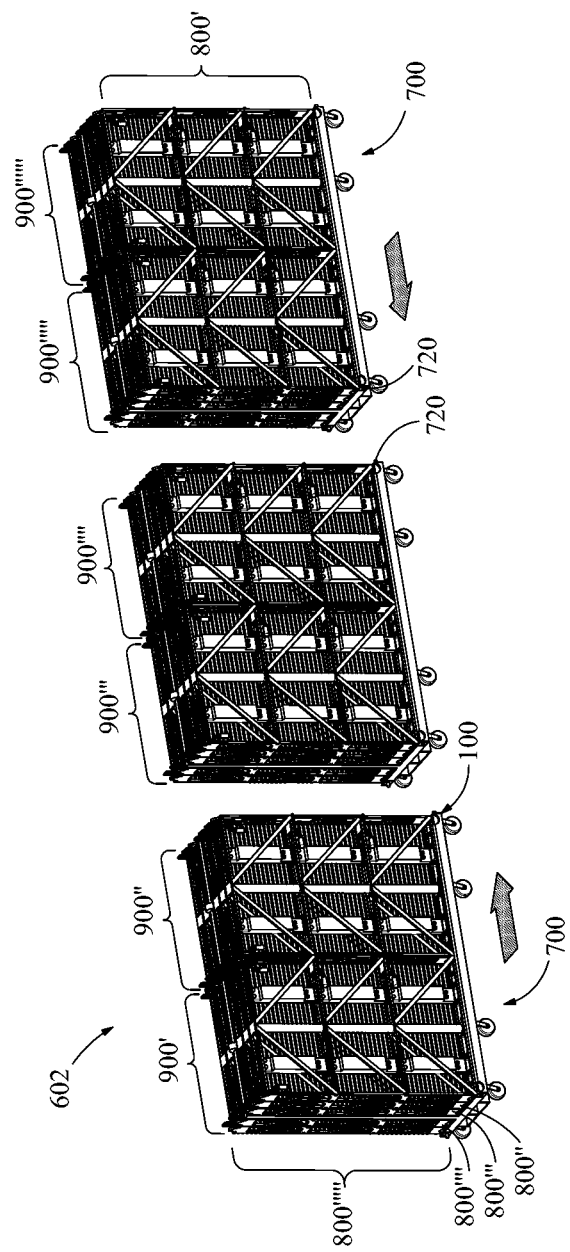
FIG. 9 shows a perspective view of an exemplary embodiment of an arrangement of display storage units.

As shown in FIG. 9, once display storage units 700 have been configured in operating mode (FIG. 8), display storage units 700 are positioned in a predetermined arrangement from each other in preparation of constructing video display system 602. In one embodiment, corresponding ends or sides of display storage units 700 include fastening features 720 such as mechanical fasteners, magnets or other suitable technique or arrangement of mating components to secure display storage units 700 in a fixed predetermined position relative to one another. In one embodiment, the corresponding ends or sides of display storage units 700 can be interconnected to each other. In one embodiment, positioning display storage units 700 in a predetermined arrangement from each other can include bringing corresponding ends of display storage units 700 toward and into close proximity with each other, but without interconnecting the display storage units. As further shown in FIG. 9, display storage units 700 collectively contain columns 900 (first column 900', second column 900", third column 900''', fourth column 900'''', fifth column 900''''', and sixth column 900''''''), as well as collectively containing tiers 800 (first tier 800', second tier 800", third tier 800''', fourth tier 800'''', and fifth tier 800'''''). In addition to securing display storage units 700 in a fixed position relative to one another, corresponding ends of respective video display modules 100 are positioned for collective engagement to one another such as by aligned latches 211 and hooks 213 (e.g., FIG. 6) to permit selective engagement of the modules to form tiers and columns while constructing video display system 602.

As shown in FIG. 10, first tier 800' of video display modules 100 is secured to a lifting device 710 such as by using cables 712 or the like that is deployed by a winch 716 (FIG. 14). In one embodiment, by virtue of selective engagement between adjacent columns 900, such as between mutually facing ends of first column 900' and second column 900", it can be possible to lift at least a portion of the columns 900, such as second column 900" without securing, for example, second column 900" to lifting device 710. In another embodiment, all ends of first tier 800' facing lifting device 710 are secured to lifting device 710. As a result, and as shown in FIG. 11, by raising lifting device 710 in a substantially vertical direction and maintaining the orientation of lifting device 710, such as substantially parallel to the ground, first tier 800', including corresponding columns 900 of video display modules 100 are similarly substantially simultaneously lifted off of the display storage units 700.

Figure 11:
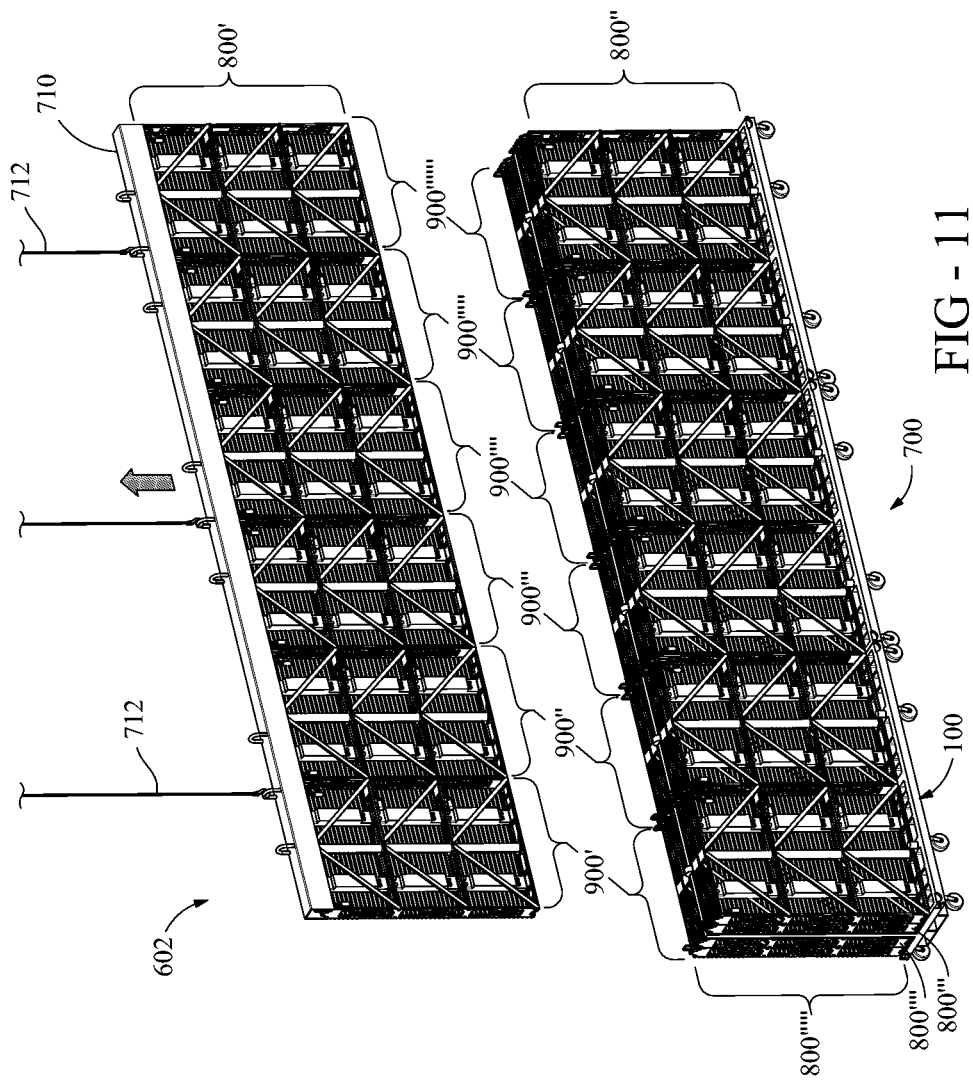
FIG. 11 shows a perspective view of the lifted first tier of the video display system in FIG. 10.

As shown in FIG. 11, once first tier 800' of video display modules 100 are sufficiently lifted off of the display storage units 700, as shown in FIG. 12, display storage units 700 are collectively moved in movement direction 714. Such movement substantially vertically aligns the lower ends of first tier 800' opposite lifting device 710 with corresponding upper ends of second tier 800" video display modules 100 positioned or stored on display storage units 700. Once the corresponding ends of the tier portions are aligned and fastening features such as latches 211 and hooks 213 (FIG. 6) sufficiently extend toward each other along interconnection region 718, the corresponding ends of the first and second tier portions 800', 800" are secured to each other. In addition, corresponding latches 211 and hooks 213 extending between adjacent columns 900 (first column 900', second column 900", third column 900''', fourth column 900'''', fifth column 900''''', and sixth column 900'''''') are selectively engaged.

In one embodiment, such as shown in FIG. 13, a method for assembling a video display system 602 includes positioning and selectively engaging a plurality of video display modules 100 together to form first tier 800', lifting first tier 800', positioning and selectively engaging a plurality of video display modules 100 together to form second tier 800" and attaching second tier 800" to the first tier. In another embodiment, the method could be achieved without lifting device 710.

As shown in FIG. 13, once first tier 800' that has been lifted by lifting device 710, and second tier 800", which is positioned or stored on display storage units 700, are secured to each other along interconnection region 718, the first and second tiers 800', 800" are collectively lifted by winches 716 (FIG. 14). At this point, the steps previously discussed such as associated with FIGS. 12 and 13 are repeated until all tiers (e.g., third tier 800''', fourth tier 800'''', and fifth tier 800''''') are lifted, such as shown in FIG. 14, whereupon the collection of tiers 800, which include columns 900, form a large video display system 602 that may be positioned in preparation of the performance.

Upon completion of the performance, the collective tiers as shown in FIG. 14 (e.g., first tier 800', second tier 800", third tier 800''', fourth tier 800'''', and fifth tier 800''''') would be lowered until the fifth tier 800''''' is lowered onto display storage units 700. Once fifth tier 800''''' has been lowered onto display storage units 700, the corresponding interconnection region between fifth tier 800''''' and fourth tier 800'''' portion is disconnected. In addition, adjacent columns (e.g., first column 900', second column 900", third column 900''', fourth column 900'''', fifth column 900''''', and sixth column 900'''''') are selectively disengaged from each other as needed so that the display storage units 700 can be moved relative to one another once disassembly has been completed. It is appreciated that a number of steps can be performed in a different order. For example, disconnecting the corresponding interconnection region between fifth tier 800''''' and fourth tier 800'''' can occur prior to, simultaneously with, or subsequent to adjacent columns 900 being selectively disengaged from each other. In an alternate embodiment, more than one video display module 100, representing adjacent tiers, may remain interconnected after being lowered onto the display storage units 700, in order to reduce the amount of disassembly of the video display system 602.

One having ordinary skill in the art appreciates that disassembly steps previously discussed would be repeated in substantially reverse order (although a number of steps during assembly that could be performed simultaneously or in an order opposite the order previously described could be similarly disassembled in different order, if desired) until the adjacent tiers and columns are disconnected from each other and from the lifting device, and the display storage units 700. Once the tiers of video display modules 100 have been disconnected and selectively disengaged from each other and from the display storage units, the display storage units may be moved from their predetermined arrangement, and placed in transport mode, such as for transporting the display storage units in preparation of the next performance.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A method for assembling and disassembling a display system comprising:
   providing a plurality of modules, each module including a light emitting unit and a video support structure, the video support structure comprising: a first support member, a second support member, a brace extending from one given pinnable joint to another pinnable joint, a portion of the second support member and a portion of the brace received by a surface formed by the first support member, the one given pinnable joint having an opening in each of the first support member, the brace and the second support member, the openings being aligned to receive one or more pins; and the one or more pins compression fitted into the aligned openings of the first support member, the brace and the second support member to form at least a portion of the video support structure;

positioning and selectively engaging a plurality of modules together to form a first tier;

lifting the first tier;

positioning and selectively engaging a plurality of modules together to form a second tier; and attaching the second tier to the first tier.

2. The method of claim 1, wherein attaching the second tier to the first tier forms a plurality of columns of modules.

3. The method of claim 1, wherein at least a portion of the at least one light emitting unit extends substantially laterally along at least one of the plurality of modules.

4. The method of claim 1, wherein the modules are mounted on carts and positioning includes aligning the carts.

5. The method of claim 4, wherein positioning includes interconnecting the carts.

6. The method of claim 4, wherein positioning and selectively engaging the plurality of modules together to form the first tier includes selectively securing the first tier of modules to a lifting device, wherein lifting the first tier includes the lifting device lifting the first tier from the carts, wherein positioning and selectively engaging the plurality of modules together to form the second tier includes positioning the carts to substantially vertically align the second tier with the first tier, and comprising lifting the first tier and second tier with the lifting device from the carts.

7. The method of claim 6, comprising:

lowering the second tier onto the carts;

disconnecting the second tier from the first tier positioning and selectively disengaging the modules forming the second tier lowering the first tier onto the carts disconnecting the first tier from the lifting device; and positioning and selectively disengaging the modules forming the first tier.

8. The method of claim 7, wherein positioning and selectively disengaging the modules forming the first tier includes moving the carts from their aligned arrangement.

9. The method of claim 6, comprising:

removing a module from at least one of the first tier and the second tier of modules by selectively disengaging and/or disconnecting the modules from at least one of the adjacent modules and the lifting device.

* * * * *